United States Patent [19]

Geurts

[11] Patent Number: 4,533,880

[45] Date of Patent: Aug. 6, 1985

[54] TUNING CIRCUIT WITH FREQUENCY SYNTHESIZER USING D/A CONVERTER

[75] Inventor: Martinus F. A. M. Geurts, Nijmegen, Netherlands

[73] Assignee: U.S. Philips Corporation, New York, N.Y.

[21] Appl. No.: 410,784

[22] Filed: Aug. 23, 1982

[30] Foreign Application Priority Data

Sep. 25, 1981 [NL] Netherlands ................ 8104415

[51] Int. Cl.$^3$ ............................................. H03L 7/06
[52] U.S. Cl. ..................................... 331/1 A; 331/10; 331/16; 331/17; 455/260
[58] Field of Search .................. 331/1 A, 10, 16, 17, 331/25; 455/260; 328/133, 134

[56] References Cited

FOREIGN PATENT DOCUMENTS 2512738 9/1976 Fed. Rep. of Germany ..... 331/1 A

OTHER PUBLICATIONS

Penner, L. "Digital Television Tuner Uses MOSLSI and Nonvolatile Memory", *Electronics*, Apr. 1, 1976, pp. 86–90.

*Primary Examiner*—Eugene R. LaRoche
*Assistant Examiner*—D. C. Mis
*Attorney, Agent, or Firm*—Thomas A. Briody; William J. Streeter

[57] ABSTRACT

A frequency synthesizer tuning circuit oscillator having an output signal frequency controlled by an input control signal is compared with the frequency specified by a source of data. The digital difference between the two compared frequencies comprises a multi-bit digital error signal of most and least significant bits. An error control signal for applying to the oscillator control input is derived by modulating the average pulse duration of a periodic pulse signal with the most significant bits of the digital error signal when the digital error signal is greater than a minimum frequency. The periodic pulse signal is amplitude modulated with the least significant bits of the digital error signal when the digital error is less than a maximum frequency. Both amplitude and pulse duration modulation of the periodic pulse signal occurs with the most and least significant bits of the digital frequency error signal when the frequency difference is between the maximum and minimum frequencies.

2 Claims, 3 Drawing Figures

TUNING CIRCUIT WITH FREQUENCY SYNTHESIZER USING D/A CONVERTER

The invention relates to a tuning circuit incorporating a frequency synthesizer circuit comprising an oscillator whose frequency is controllable by a control signal, a tuning data signal source, a digital difference determining circuit for determining the digital value of the difference between the frequency determined by the tuning data signal source and the frequency of the oscillator, and a digital-to-analogue converter for converting the digital difference into the control signal, the digital-to-analogue converter comprising a modulation circuit for generating a periodically occurring pulse pattern which depends on the digital difference and from which the control signal is obtained by means of a smoothing circuit.

Valvo Entwicklungsmitteilungen 70, Nov. 1977, pages 33-35 discloses a tuning circuit of the above-described type, wherein the periodically occurring pulse pattern is a periodically occurring pulse whose duration depends on the frequency difference. If the frequency difference is measured in digital quantities consisting of a number of bits, this number of bits must be sufficiently large to ensure, when the oscillator is in the adjusted state, a sufficiently small deviation from the tuning datum. It must be possible for the pulse duration in each period to become very short or the duration of the period must be taken long. The first possibility is limited by the speed at which the circuit can operate and consequently by the integrated circuit technology, and the second possibility is limited by the duration of the waiting period which is considered to be permissible during a tuning procedure.

It is an object of the invention to allow a sufficiently short waiting period without the need for an excessively fast operating integrated circuit.

SUMMARY OF THE INVENTION

According to the invention, a tuning circuit of the type described in the opening paragraph comprises a modulation circuit for only average pulse duration modulating the pulse pattern by the most significant bits of the frequency difference greater than a predetermined minimum value, and a circuit for only amplitude modulating the entire pulse pattern for the least significant bits of the frequency difference at a value of this difference smaller than a predetermined maximum value.

This measure limits the number of bits of the frequency difference to be converted into a control signal by average pulse duration modulation, so that, the duration of the period remaining the same, the operational speed of the circuit in the digital-to-analogue converter may be limited.

The invention is based on the recognition of the fact that small irregularities in the proportionality between the digital quanitity to be converted and the control signal are permissible in a frequency synthesizer circuit.

It should be noted that a tuning circuit having a combined pulse duration and amplitude modulation is known from Electronics, published Apr. 1st 1976, pages 86-90. In the circuit described there the amplitude modulation is not effected on the entire pulse pattern but on a very small portion thereof. This requires an intermediate conversion from pulse duration modulation to amplitude modulation by means of an additional smoothing network which is not integrable. The tuning circuit in that case is a voltage synthesizer circuit which requires a perfectly constant proportionality between the digital quantity to be converted and the converted signal.

The invention will now be described in greater detail by way of example with reference to the drawing.

DESCRIPTION OF THE PREFERRED EMBODIMENT

Figure 1:
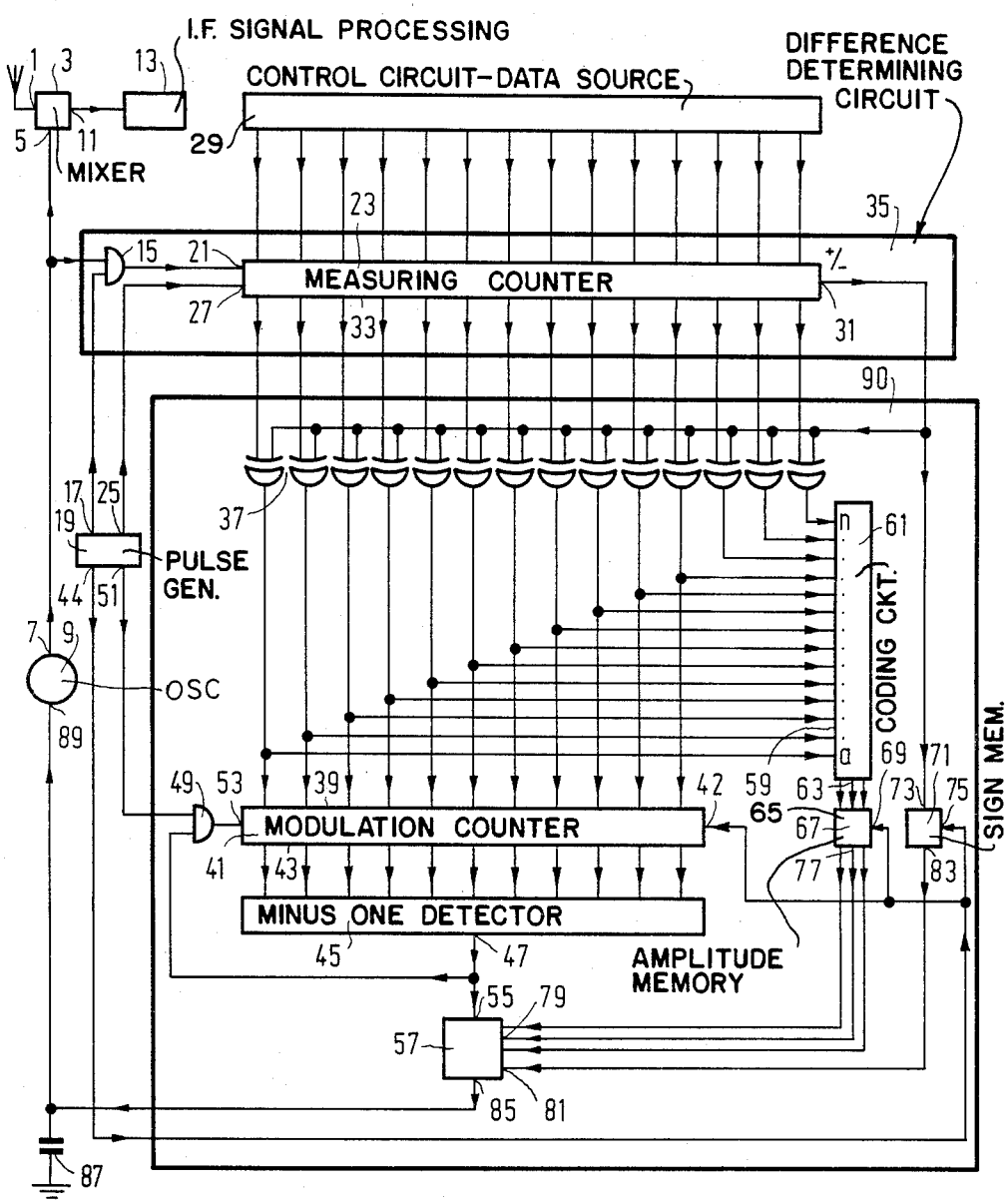
FIG. 1 illustrates by means of a block schematic circuit diagram a receiver incorporating a tuning circuit in accordance with the invention.

In FIG. 1 a received signal is applied to an input 1 of a radio frequency and mixer section 3 and an oscillator signal obtained from an output 7 of an oscillator 9 is applied to an input 5. As a result there is produced at an output 11 of the radio frequency and mixer section 3 an intermediate frequency signal which is further processed by an intermediate frequency signal processing circuit 13.

The output 7 of the oscillator 9 is further connected to an input of an AND-gate 15, a further input of which receives from an output 17 of a pulse generator 19 a periodically occurring pulse in response to which the AND-gate 15 becomes conductive and applies the oscillator signal to a counting signal input 21 of a measuring counter 23.

Prior to the occurrence of a pulse at the output 17 of the pulse generator 19 there appears at an output 25 thereof a pulse which is applied to a writing signal input 27 of the measuring counter 23, causing a tuning datum received from a control circuit 29 which acts as a tuning datum signal source, to be written into the measuring counter 23. As a result thereof, each time the AND-gate 15 starts to conduct, the measuring counter 23 has a counting state corresponding to the tuning datum.

At the end of a period in which the AND-gate 15 is conductive the measuring counter 23 has assumed a state which corresponds to the frequency difference between the frequency determined by the tuning datum and the frequency of the oscillator signal at the counting signal input 21. If this difference is positive, that is to say if the zero state in the measuring counter 23 has not been passed, then a zero signal appears at a sign signal output 31 of the measuring counter 23 and in the event of a negative difference, so if the zero state in the measuring counter 23 has been passed, there appears a one-signal.

At the end of each conduction period during which the AND-gate 15 conducts an output combination 33 of the measuring counter 23 shows a digital signal combination which represents the value of the difference between the frequency determined by the tuning datum and the oscillator frequency. The AND-gate 15 and the measuring counter 23 form a difference determining circuit 35.

The output combination 33 is connected to an exclusive OR-gate combination 37 which is further connected to the sign signal output 31 of the counter 23. The exclusive-OR gates of this gate combination 37 produce in response to the signals applied thereto a signal combination which substantially corresponds to the absolute value of the frequency difference. The very slight deviation from unity with respect to that absolute value occurring at negative values of the frequency difference may if so desired be corrected by operating a gate circuit by means of the sign signal at the output 31 of the measuring counter 33, which gate circuit can apply an additional counting pulse to the input 21 of the measuring counter 23.

This absolute value is in this case a fourteenbit signal combination which becomes available at the outputs of the exclusively-OR gates 37 and the eleven most significant bits of which are applied to an input combination 39 of a modulation counter 41. After each period in which the AND-gate 15 is conductive, the modulation counter 41 receives at a writing signal input 42 a writing pulse from an output 44 of the pulse generator 19. A minus-one detector 45 is connected to an output signal combination 43 of the modulation counter 41. On writing the eleven most significant bits into the modulation counter 41 at the occurrence of the writing signal at the input 42, a minus-one detector 45 detects that the position of the modulation counter 41 deviates from minus-one and supplies from an output 47 of the minus-one detector 45 a one-signal in response to which an AND-gate 49 is opened, which conveys counting pulses received from an output 51 of the pulse generator 19 to a counting signal input 53 of the modulation counter 41. The AND-gate 49 is blocked when the down-counting modulation counter 41 has reached the minus-one position and the minus-one detector 45 produces a zero signal at its output 47.

As a result thereof a perodically occurring pulse whose duration $\tau$ depends on the eleven most significant bits of the above-mentioned frequency difference is then produced at the output 47 of the minus-one detector 45. This is represented by the characteristic 347 of FIG. 3. The pulse duration $\tau$ as a function of the frequency difference $\Delta f$ follows therein a function which is the non-fractional part of $((\Delta f/8)+1)$.

The periodically occurring pulse at the output 47 of the minus-one detector 45 is applied to an input 55 of a current source circuit 57.

The exclusive OR-gate combination 37 has the outputs of all its gates connected to an input combination 59 of a coding circuit 61 having an output combination 63 for a three-bit signal connected to an input combination 65 of an amplitude memory 67. Amplitude memory 67 has a writing signal input 69 connected to the output 44 of the pulse generator 19. This amplitude memory 67 is written in simultaneously with the modulation counter 41, which also holds for a sign memory 71 an input 73 connected to the sign signal output 31 of the counter 23, and a writing input signal 75 connected to the output 44 of the pulse generator 19. As a result thereof, a three-bit signal combination whose value I as a function of the frequency difference $\Delta f$ is represented by characteristic 379 of FIG. 3 is applied, together with the pulse at the input 55 of the current generator 57, to an input combination 79 of the current generator 57, which input combination is connected to an output combination 77 of the amplitude memory 67.

In addition, a sign signal received from an output 83 of the sign signal memory 71 is applied to an input 81 of the current generator 57.

Figure 3:
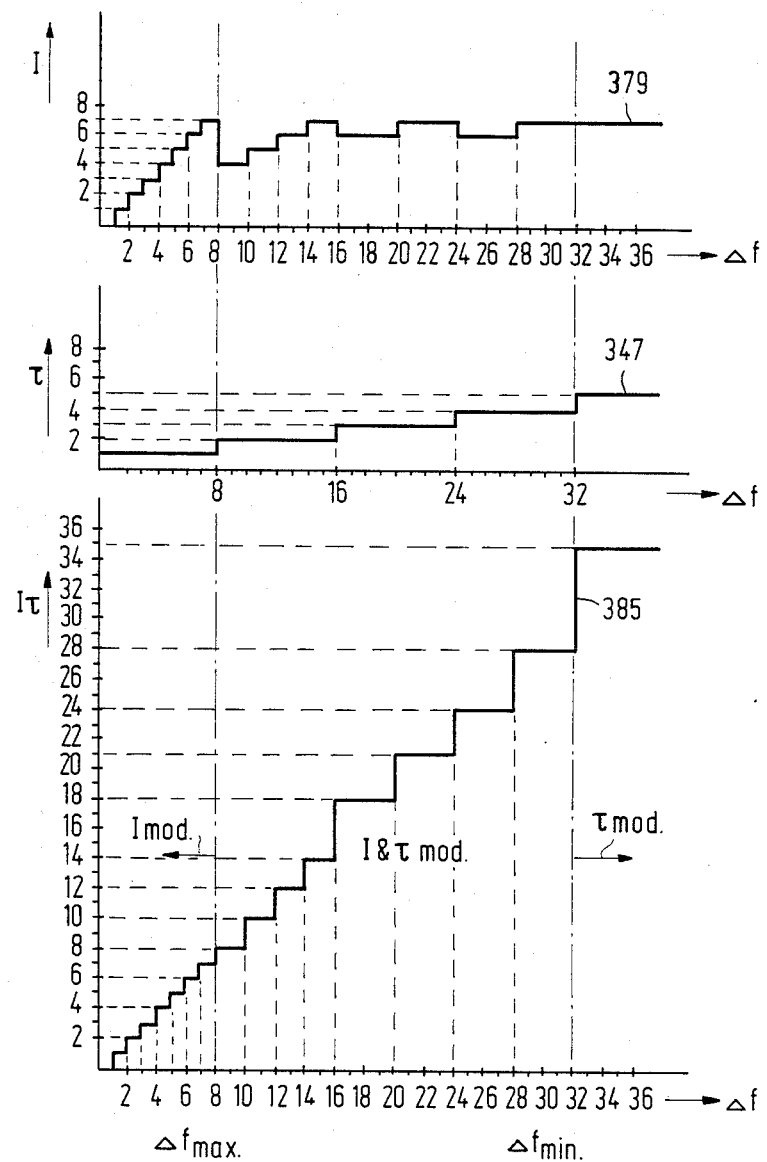
FIG. 3 illustrates by means of some diagrams the conversion obtained with the circuit shown in FIG. 2.

At an output 85 of the current generator 57 there are produced periodically occurring current pulses whose duration $\tau$ is determined by the most significant bits of the frequency difference and the amplitude I by the three bits applied to the input combination 79, so that the product I $\tau$ of amplitude and duration as a function of the frequency difference varies in accordance with characteristic 385 of FIG. 3.

The pulse pattern at the output 85 of the current generator 57 has, as is shown in FIG. 3 for a value below a maximum value 8 height, only an amplitude modulation which is determined by the three least significant bits of the frequency difference and above a minimum value 32 (thirty-two) only a duration modulation determined by the eleven most significant bits of the frequency difference. For the frequency difference value located between these maximum and minimum values, the amplitude as well as the pulse duration are determined by the least and the most significant bits of the frequency difference.

The current pulses at the output 85 of the current generator 57 charge or discharge a capacitor 87 from which a control signal is derived which is applied to a control signal input 89 of the oscillator 9 and determines the frequency thereof. This control signal controls the frequency of the oscillator 9 in such a manner that the difference between the frequency and the tuning data becomes zero.

In conjunction with the modulation counter 39, the AND-gate 49, the minus-one detector 45, the current generator 57, the coding circuit 61, the amplitude memory 67 and the sign memory 71 the exclusive OR-gate combination 37 forms a modulation circuit 90. The coding circuit 61 and the current generator 57 is shown in FIG. 2 by means of a block diagram.

Figure 2:
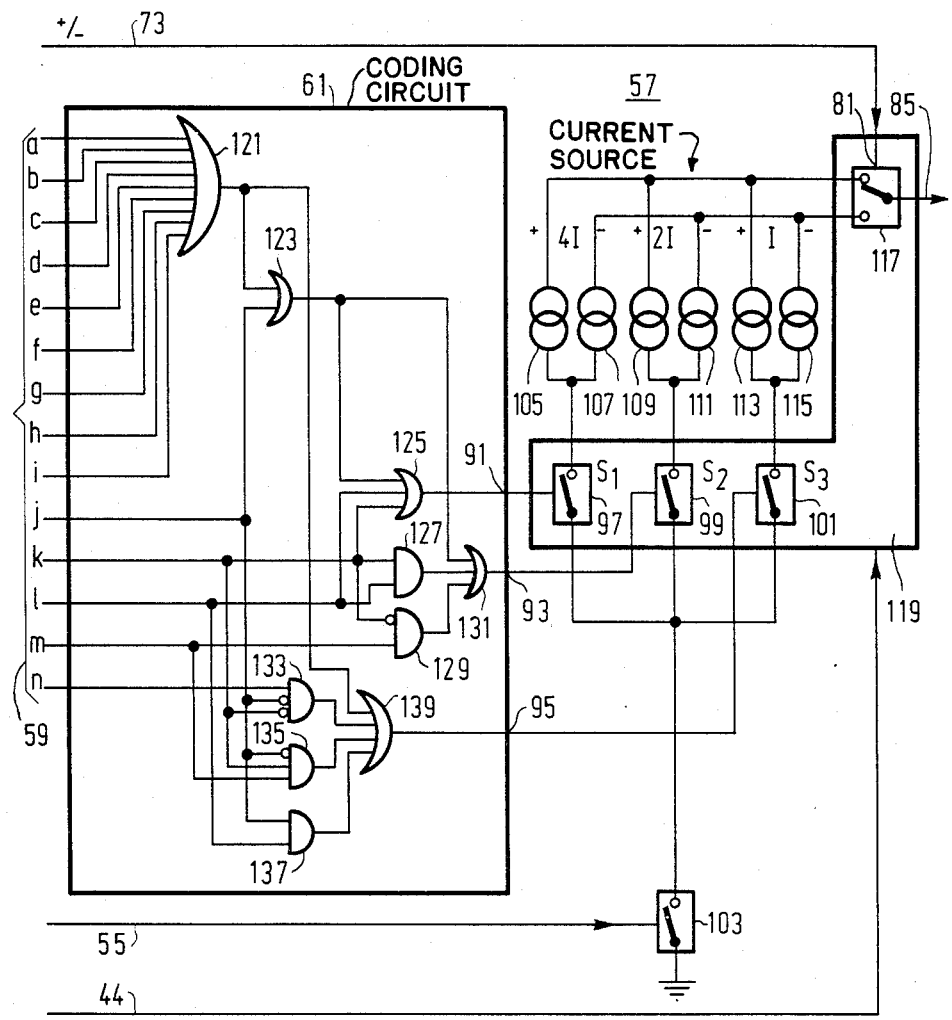
FIG. 2 shows a possible embodiment of a portion of a modulation circuit for a tuning circuit in accordance with the invention.

In FIG. 2 components corresponding with those of FIG. 1 are given the same reference numerals.

The input combination 59 of the coding circuit 61 has fourteen inputs, a, b, c, d, e, f, g, h, i, j, k, l, m, n, whose significance decreases from a to n.

The coding circuit 61 has three outputs 91, 93, 95 on which signals are produced which operate the respective switches 97, 99, 101.

On the one hand the switches 97, 99 and 101 are in series with a switch 103 which is operated by the pulse duration signal at the input 55 of the current generator 57, and on the other hand in series with respective pairs of current sources 105, 107 and 109, 111 and 113, 115 which apply a current $+4I$, $-4I$, $+2I, -2I$ and $+1I$ and $-1I$, respectively to a change-over switch 117, which is operated by the sign signal applied to the input 81 and whose other side is connected to the output 85. For the sake of clarity the amplitude and sign memory circuits are not shown in the drawing but only symbolically designated by the reference numeral 119. They are controlled by the signal on the connecting wire 44, as is indicated in the description of FIG. 1.

In order to obtain the amplitude modulation such as it is represented by the characteristic 379 of FIG. 3, a switching signal $S_1$ is generated at the output 91 of the coding circuit 61, a switching signal $S_2$ on the output 93 and a switching signal $S_3$ on the output 95, which signals are defined by the following logic formulae:

$$S_1=(a+b+c+d+e+f+g+h+i)+j+k+l$$

$$S_2=(a+b+c+d+e+f+g+h+i)+j+kl+k'm$$

$$S_3=(a+b+c+d+e+f+g+h+i)+j'k'n+j'km+jl$$

the primes in these formulae indicating an inversion.

In $S_1$ the term (a+b+c+d+e+f+g+h+i) is provided by an OR-gate 121, +j by an OR-gate 123 and +k+l by an OR-gate 125.

In $S_2$ the term (a+b+c+d+e+f+g+h+i) is also provided by the OR-gate 121 and the terms +j+kl+k'm by two AND-gates 127, 129 and an OR-gate 131.

In $S_3$ the term (a+b+c+d+e+f+g+h+i) is again provided by the OR-gate 121 and the term +j'k'n+j'km+jl by three AND-gates 133, 135, 137 and an OR-gate 139.

As can be seen from the characteristic 385 of FIG. 3 the steps in the I $\tau$ values increase versus an increasing frequency difference and occur at larger increases of that frequency difference. With a digital-to-analogue conversion of a frequency synthesizer circuit this is permissible since the behavior of the control circuit is of interest and not the actual value of the output signal of the digital-to-analogue converter.

In the embodiment a modulation in the duration of one signal pulse per period is used for the average pulse duration; it will be obvious that if so desired the number of pulses per period may also be changed by the modulation.

In addition, the number of bits for only amplitude and average pulse duration modulation, respectively and a combination thereof can be chosen at one's option. The above embodiment was found to be particularly advantageous. If so desired, the coding circuit 61 may be omitted if $\Delta f$ max=$\Delta f$ min is chosen and must be adapted if the range in which combined pulse duration and amplitude modulation is effected is changed. The design thereof can be realized in a simple manner with the aid of a truth table.

Although the foregoing describes a tuning circuit in a receiver, it will be clear that a tuning circuit in accordance with the invention is also suitable for use in, for example, a transmitter or a measuring instrument.

What is claimed is:

1. A frequency synthesis tuning circuit comprising:
an oscillator having a frequency control input;
a source of data specifying a tuning frequency;
a digital frequency determining means for receiving said data specifying a tuning frequency and a signal from said oscillator, and producing a multiple bit digital frequency error signal having bits of most and least significance, proportional to the frequency difference between said oscillator output signal and the frequency specified by said data; and,
modulator circuit means for generating a periodic pulse signal representing said frequency difference for controlling said oscillator, said modulating circuit means including:
means for modulating the average pulse duration of said periodic pulse signal by the most significant bits of said error signal when said frequency difference is greater than a minimum frequency difference;
means for amplitude modulating said modulated periodic pulse signal with the least significant bits of the digital error signal when said frequency difference is less than a maximum frequency difference; and
means for amplitude and pulse duration modulating said periodic pulse signal with the most and least significant bits of said digital frequency error signal when said frequency difference is between said maximum and minimum frequency differences.

2. A tuning circuit as claimed in claim 1, wherein said maximum frequency difference is less than said minimum frequency differences while the modulation circuit is further combines average pulse duration modulation and amplitude modulation at a frequency difference which lies between the maximum and the minimum frequency differences.

* * * * *

UNITED STATES PATENT AND TRADEMARK OFFICE
CERTIFICATE OF CORRECTION

PATENT NO. : 4,533,880
DATED : August 6, 1985
INVENTOR(S) : MARTINUS F.A.M. GEURTS It is certified that error appears in the above-identified patent and that said Letters Patent is hereby corrected as shown below:

Delete from Claim 2 in column 6, line 35

"is further"

Signed and Sealed this

First Day of September, 1987

Attest:

DONALD J. QUIGG

Attesting Officer

Commissioner of Patents and Trademarks